(12) United States Patent
Laurösch et al.

(10) Patent No.: US 6,348,745 B1
(45) Date of Patent: Feb. 19, 2002

(54) SWITCHGEAR CABINET MONITORING ARRANGEMENT

(75) Inventors: Sven Laurösch, Haiger; Markus Hain, Dillenburg; Heinrich Strackbein, Biebertal, all of (DE)

(73) Assignee: Rittal-Werk Rudolf Loh GmbH & Co. KG, Herborn (DE)

( * ) Notice: Subject to any disclaimer, the term of this patent is extended or adjusted under 35 U.S.C. 154(b) by 0 days.

(21) Appl. No.: 09/524,482

(22) Filed: Mar. 13, 2000

(30) Foreign Application Priority Data

Mar. 13, 1999 (DE) .......................... 199 11 310

(51) Int. Cl.[7] .............................. H02B 1/24
(52) U.S. Cl. ..................................... 307/112
(58) Field of Search ................. 307/112, 113, 307/115, 116, 119, 125, 126, 132 M, 137, 150

(56) References Cited

U.S. PATENT DOCUMENTS 4,484,086 A * 11/1984 Koppl .......................... 207/112
6,222,448 B1 * 4/2001 Beck et al. .................. 340/506

FOREIGN PATENT DOCUMENTS

DE 196 09 689 9/1997

* cited by examiner

*Primary Examiner*—Matthew Nguyen
(74) *Attorney, Agent, or Firm*—Pauley Petersen Kinne & Erickson

(57) ABSTRACT

A switchgear cabinet monitoring arrangement with a central control arrangement for monitoring, controlling and/or regulating switchgear cabinet functions, and having a base device with inputs and outputs, in which monitoring and control components and a voltage supply device are arranged. Adaptation to different requirements is achieved because the base device has several function card insertion slots. Several function cards with different monitoring, control, regulation and/or switching functions are provided with an appropriate identification and for selective insertion in the function card insertion slots. An identification device determines which function card insertion slots (2.1, ... 2N) are occupied and of what type is the possibly inserted function card.

18 Claims, 1 Drawing Sheet

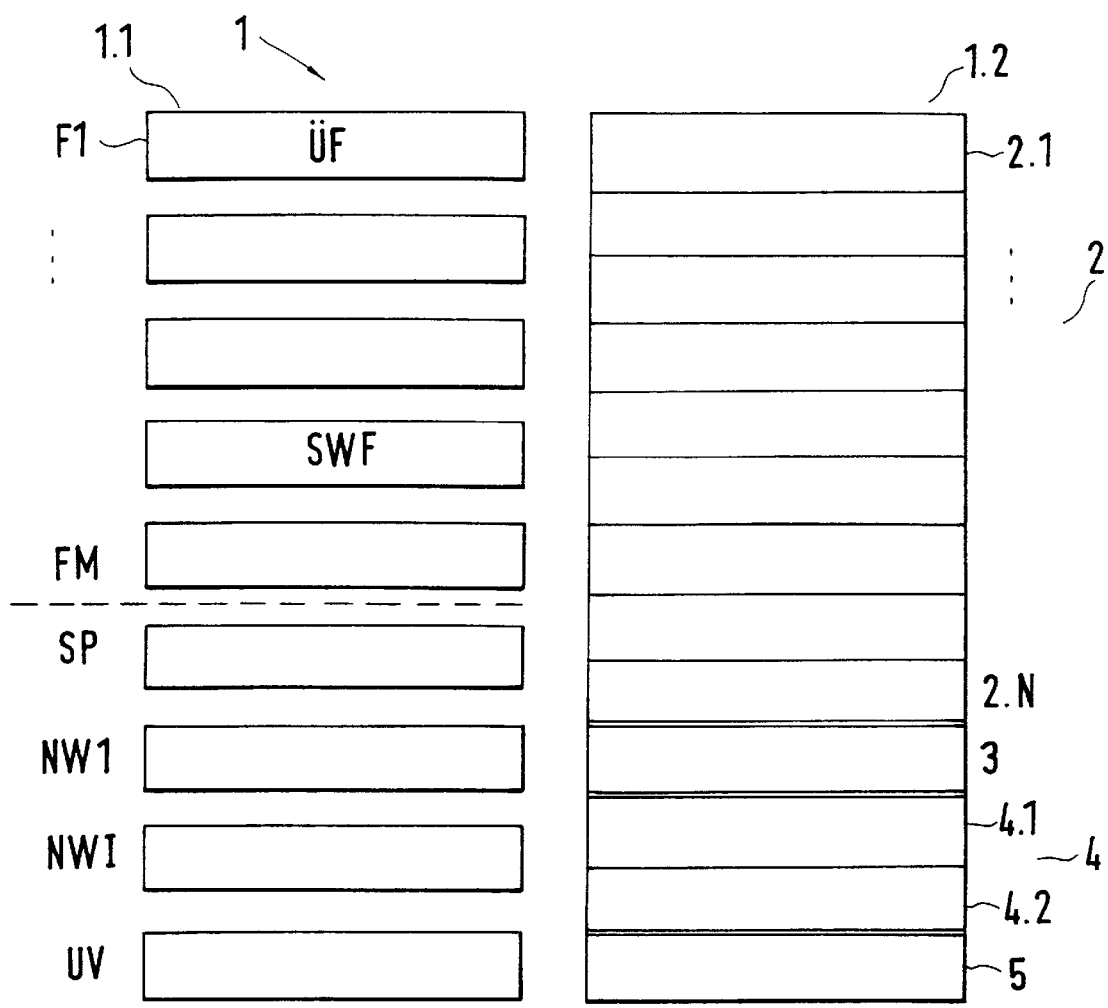

SWITCHGEAR CABINET MONITORING ARRANGEMENT

BACKGROUND OF THE INVENTION

1. Field of the Invention

This invention relates to a switchgear cabinet monitoring arrangement with a central control arrangement for monitoring, controlling and/or regulating switchgear cabinet functions, and having a base device with inputs and outputs, in which monitoring and control components and a voltage supply device are arranged.

2. Description of Prior Art

A monitoring arrangement of this type is known from German Patent Reference DE 196 09 689 A1. This known switchgear cabinet monitoring arrangement is matched to various uses of the switchgear cabinet and constitutes, together with sensor devices for different measured values, such as temperature, closing status of the door, vibrations, smoke development and humidity, as well as actuators, by which it is possible to react to sensor signals. With control and regulation options, a design of the switchgear cabinet for a multitude of uses, it is possible to react to the sensor signals in a suitable manner. By programming, the monitoring functions can be easily adapted to the respective use conditions, for example within enclosed spaces or in the open, or for operation in a moisture-laden environment. Monitoring with remote observation devices via a bus system is also possible but requires a considerable cost outlay.

SUMMARY OF THE INVENTION

One object of this invention is to provide a switchgear cabinet monitoring arrangement of the type mentioned at the outset, which can be simply adapted to different requirements of a user, wherein an outlay can be simply adapted to the respective requirements.

This object is achieved with a switchgear cabinet monitoring arrangement as set forth in this specification and/or in the claims. A base device is equipped with several insertion slots for function cards. Several function cards with different monitoring, control, regulation and/or switching functions are provided with an appropriate identification and for selective insertion in the function card insertion slots. An identification device is provided for determining which function card insertion slots are occupied and of what type is the possibly inserted function card.

With this structure it is possible to simply design the same base device for different use conditions and, if required, to also refit it, wherein only different or additional function cards need to be inserted into the function card insertion slots. It is not important which function card is inserted into which insertion slot, whether all insertion slots are occupied, or whether several function cards of the same type are inserted into different insertion slots. The correct assignment in regard to the properties of the function card is automatically determined by means of the identification device, so that the monitoring, control, regulation and/or switching functions can be easily used. If, for example, a user is only interested in the regulation of a temperature inside the switchgear cabinet, the user only requires a simple function card for temperature monitoring and control of a climate control device, such as a cooling device or a heating device. It is possible to do without multitudinous other function-monitoring operations, so that the cost outlay is minimized. In a different environment, for example in the outdoors and at a remote location, it can be important to determine, in addition to the temperature, also the locked state of the door, the degree of humidity or the development of smoke. Appropriate function cards which, for example, can also control the triggering of an extinguishing device, are inserted into the base device. Because of the modular, building block-like structure it is possible for the user to adapt the switchgear cabinet monitoring arrangement to specific requirements.

If the function cards are divided into a group of function cards for monitoring and a group of function cards for switching, it is possible to realize, in addition to the monitoring functions, switching functions, by means of which signals can be passed in different ways, so that interrogation and programming options from various locations and displays at various locations is possible.

Different suitable expansion options of the function monitoring and control, or respectively regulation, include at least two different ones from the groups of function cards with digital inputs, function cards with relay outputs, function cards for analog temperature-measuring resistors, function cards for connection to a bus, function cards with analog inputs, function cards for voltage monitoring and function cards with differential inputs.

Energy supply can be simply realized with a voltage supply device that has at least one voltage supply insertion slot and at least two different voltage supply plug-in units in the base device, which can be selectively inserted into the voltage supply insertion slot. In this case it is advantageous, for example for supplying the individual insert cards, on the one hand, and for supplying, for example, connected sensors on the other hand. A first voltage supply plug-in unit is designed for a voltage range between 48V and 240V of a.c. voltage or d.c. voltage and supplies the energy for the base device and the insertion cards. A further voltage supply plug-in unit opposite the first voltage supply plug-in unit additionally has a 24V d.c. voltage net element.

Alternative possibilities for the supply of sensors or actuators connected with the function cards include the function card with digital inputs, the function card for connection to a bus, the function card with analog inputs and/or the function card with the differential inputs, which can selectively have a voltage of 24V from the further voltage supply plug-in unit or from an external voltage supply.

A step is advantageous for a simple, well arranged provision of the supply voltage, wherein the voltage made available by the further voltage supply plug-in unit is made available to the insertion slots by means of a supply bus.

The step, wherein the identification device has a memory card inserted into a memory card insertion slot of the base device, adds to a well arranged design.

Various switching options and connections are realized. For example, the switching function cards have at least one insertion card from the group of switching cards for a connection of a keyboard, mouse and monitor, a second switching card for switching between a personal computer and a console, and a further switching card for connecting several base devices.

If the base device has at least one insertion slot for an electrical supply net card, and at least one electrical supply card from the group of ether net cards, token ring cards, fast ethernet cards, modem cards, ISDN cards and RS 232 cards are provided, and monitoring and control functions can also be performed from remote locations and in a linkage of switchgear cabinet monitoring arrangements.

BRIEF DESCRIPTION OF THE DRAWINGS

This invention will be explained in greater detail by an exemplary embodiment, making reference to the drawings wherein the single drawing FIGURE schematically represents essential elements of a base device, according to one preferred embodiment of this invention.

DESCRIPTION OF PREFERRED EMBODIMENTS

A base device 1 has several insertion slots 1.2 for insertion cards 1.1. The insertion slots 1.2 are divided into four insertion slot areas, namely a function card insertion slot area 2, a memory card insertion slot 3, an electrical supply net card insertion slot area 4, and a voltage supply card insertion slot area 5. The function card insertion slot area 2 and the electrical supply net card insertion slot area 4 have several insertion slots 2.1 to 2.N, or respectively 4.1 and 4.2, while the memory card insertion slot 3 and the voltage supply card insertion slot area 5 respectively have one insertion slot, but there is also an option of several insertion slots for them.

Several different function cards F1 to FM are provided for the function card insertion slots 2.1 to 2.N, wherein the number of function cards F1 to FM can be greater, the same or less than the number of function card insertion slots 2.1 to 2.N. It is also not necessary that all function card insertion slots 2.1 to 2.N be occupied during operation. It is also possible to employ several identical function cards F1 to FM. As function cards F1 to FM, those with switching functions SWF, for one, are provided, as well as those with monitoring/control functions ÜF.

The function cards F1 to FM for the monitoring/control functions ÜF are designed for different monitoring, or respectively control functions. One function card has several, for example four, relay outputs for relays with d.c. contacts of 5 Ampere/250 Volt d.c. voltage. Three terminals (collector, opener, closer) are available for one relay. The relays are screened by a filter, so that no problems with split-pole motors or similar consumers can occur.

Another function card is designed for analog temperature resistors NTC of 10 kOhm. A third function card for the monitoring/control function ÜF is used for connecting a bus, in particular a 12C bus. Reading devices or other accessories can be connected, wherein 8 to 16 jacks are available for the bus outlet. Two terminals on the exterior are available for an external voltage source. 24 Volt are available for supplying different sensors with power.

A further function card with a monitoring/control function has, for example, four free analog inputs for a current between 4 and 20 mA, and makes a voltage of 24 Volt available for sensors which might possibly be connected.

Moreover, a function card for voltage monitoring is provided, by means of which, for example, three voltages in the range between 0 and 255 Volt a.c. current can be monitored. All voltages are galvanically separated in order to prevent damages.

A further function card for the monitoring/control function ÜF makes digital inputs available. The inputs are connected via optical couplers, which are operated at a d.c. voltage of 24 Volt. Such a digital input is suitable, for example, for connecting a vibration sensor. Jacks for suppling sensors with energy at 24 Volts are also provided for this function card.

Finally, a function card with several differential inputs in accordance with the alarm system principle is also provided, wherein this function card also makes 24 Volts available for supplying sensors with energy.

The function cards for the switching function SWF include a function card for the connection with a keyboard, a mouse and a monitor, a further function card for connection of PC outputs for a keyboard, a mouse and a monitor, and a further function card for connecting several base devices with each other. Thus, it is possible with these switching functions SWF to provide various connections of personal computers and consoles with the keyboard, mouse and monitor, as well as with different base devices 1, so that interrogations can be performed from different positions and displays at different positions, and also programming steps from different positions.

The monitoring control and switching functions can be combined in any arbitrary way. The linkage and programming of the system is completely open. The user can perform the setting and programming by means of software tools.

An identification device is provided for determining which function cards are employed and, for example, has a memory card SP with a flash program memory, which is inserted into the memory card insertion slot 3. It is also possible to determine by means of the memory card SP whether and which electrical supply net card NW is inserted into the electrical supply net insertion card area. The memory card SP furthermore also takes on control tasks. Ether net cards, token ring cards, fast ethernet cards, modem cards, ISDN cards and RS 232 cards are provided as electrical supply net cards NW, so that different electrical supply net connections can be provided with a simple design of the base device 1.

Two different voltage supply plug-in units UV are provided for the voltage supply of the insertion cards 1.1, which can be selectively inserted into the voltage supply card insertion slot 5. One of the voltage supply plug-in units is laid out for a voltage range between 48 and 240 Volt of a.c. voltage or d.c. voltage. This voltage supply plug-in unit provides the energy for the base device 1.1.

The other voltage supply plug-in unit provides the same function and has a separate net element for making a d.c. voltage of 24 Volt available. The 24 Volt d.c. voltage is intended for the operation of external sensors and devices, is made available via the mentioned digital inputs, analog inputs and differential inputs, and is designed for a maximum current output of 500 mA. The output is short circuit-resistant.

The potentials of the 24 Volt d.c. voltage and of the supply voltage of the base device 1 with the insertion cards 1.1 are completely separate. The 24 Volt d.c. voltage is accessible from the outside at the voltage supply plug-in unit and is made internally available to the insertion slots 1.2 via a supply bus, but is not used for supplying the insertion cards per se, but for the connection of external devices and sensors.

It is possible by means of the described design to adapt the switchgear cabinet monitoring arrangement to various intended uses, wherein the cost outlay can be kept low in case of lesser requirements, but on the other hand it is also possible to satisfy extensive requirements made on the monitoring, control and regulating functions.

What is claimed is:

1. In a switchgear cabinet monitoring arrangement having a central control arrangement for at least one of monitoring, controlling and regulating switchgear cabinet functions, and having a base device (1) with inputs and outputs, in which monitoring and control components (F1, . . . FM, SP) and a voltage supply device (5) are arranged, the improvement comprising:

the base device (1) being equipped with a plurality of function card insertion slots (2.1, . . . 2N), a plurality of function cards (F1 . . . FM) with different at least one of monitoring, control, regulation and switching functions each with an identification and the function cards (F1 . . . FM) for selective insertion in the function card insertion slots (2.1, . . . 2N), and an identification device with means for determining which function card insertion slots (2.1, . . . 2N) are occupied and a type of the inserted function card (F1. . . FM).

2. In the switchgear cabinet monitoring arrangement in accordance with claim 1, wherein the function cards (F1 . . . FM) are divided into a group of function cards for monitoring (ÜF) and a group of function cards for switching (SWF).

3. In the switchgear cabinet monitoring arrangement in accordance with claim 2, wherein the function cards (F1 . . . FM) have at least two different ones from the groups of function cards with digital inputs, function cards with relay outputs, function cards for analog temperature-measuring resistors, function cards for connection to a bus, function cards with analog inputs, function cards for voltage monitoring and function cards with differential inputs.

4. In the switchgear cabinet monitoring arrangement in accordance with claim 3, wherein the voltage supply device has at least one voltage supply insertion slot (5) and at least two different voltage supply plug-in units (UV) in the base device (1) which can be selectively inserted into the voltage supply insertion slot (5).

5. In the switchgear cabinet monitoring arrangement in accordance with claim 4, wherein a first voltage supply plug-in unit having a voltage range between 48V and 240V of one of a.c. voltage and d.c. voltage and supplies energy for the base device (1) and a second voltage supply plug-in unit opposite the first voltage supply plug-in unit has a 24V d.c. voltage net element.

6. In the switchgear cabinet monitoring arrangement in accordance with claim 5, wherein at least one of the function cards with digital inputs, the function cards for connection to a bus, the function cards with analog inputs and the function cards with the differential inputs can be selectively provided with a voltage of 24V from one of the second voltage supply plug-in unit and an external voltage supply.

7. In the switchgear cabinet monitoring arrangement in accordance with claim 6, wherein the voltage made available by the second voltage supply plug-in unit is made available to the insertion slots (1.2) by a supply bus.

8. In the switchgear cabinet monitoring arrangement in accordance with claim 7, wherein the identification device has a memory card (SP) inserted into a memory card insertion slot (3) of the base device (1).

9. In the switchgear cabinet monitoring arrangement in accordance with claim 8, wherein the switching function cards (SWF) have at least one insertion card from a group of switching cards for a connection of a keyboard, a mouse and a monitor, a second switching card for switching between a personal computer and a console, and a further switching card for connecting several base devices (1).

10. In the switchgear cabinet monitoring arrangement in accordance with claim 9, wherein the base device (1) has at least one electrical supply net card insertion slot (4.1, 4.2), and there is at least one electrical supply card (NW1 . . . NW1) from a group of ether net cards, token ring cards, fast ethernet cards, modem cards, ISDN cards and RS 232 cards.

11. In the switchgear cabinet monitoring arrangement in accordance with claim 1, wherein the function cards (F1 . . . FM) have at least two different ones from groups of function cards with digital inputs, function cards with relay outputs, function cards for analog temperature-measuring resistors, function cards for connection to a bus, function cards with analog inputs, function cards for voltage monitoring and function cards with differential inputs.

12. In the switchgear cabinet monitoring arrangement in accordance with claim 1, wherein the voltage supply device has at least one voltage supply insertion slot (5) and at least two different voltage supply plug-in units (UV) in the base device (1) which can be selectively inserted into the voltage supply insertion slot (5).

13. In the switchgear cabinet monitoring arrangement in accordance with claim 12, wherein a first voltage supply plug-in unit having a voltage range between 48V and 240V of one of a.c. voltage and d.c. voltage and supplies energy for the base device (1) and a second voltage supply plug-in unit opposite the first voltage supply plug-in unit has a 24V d.c. voltage net element.

14. In the switchgear cabinet monitoring arrangement in accordance with claim 3, wherein at least one of the function cards with digital inputs, the function cards for connection to a bus, the function cards with analog inputs and the function cards with the differential inputs can be selectively provided with a voltage of 24V from one of the second voltage supply plug-in unit and an external voltage supply.

15. In the switchgear cabinet monitoring arrangement in accordance with claim 5, wherein the voltage made available by the second voltage supply plug-in unit is made available to the insertion slots (1.2) by a supply bus.

16. In the switchgear cabinet monitoring arrangement in accordance with claim 1, wherein the identification device has a memory card (SP) inserted into a memory card insertion slot (3) of the base device (1).

17. In the switchgear cabinet monitoring arrangement in accordance with claim 2, wherein the switching function cards (SWF) have at least one insertion card from a group of switching cards for a connection of a keyboard, a mouse and a monitor, a second switching card for switching between a personal computer and a console, and a further switching card for connecting several base devices (1).

18. In the switchgear cabinet monitoring arrangement in accordance with claim 1, wherein the base device (1) has at least one electrical supply net card insertion slot (4.1, 4.2), and there is at least one electrical supply card (NW1 . . . NW1) from a group of ether net cards, token ring cards, fast ethernet cards, modem cards, ISDN cards and RS 232 cards.

* * * * *